United States Patent [19]
Nakashima et al.

[11] 3,849,791
[45] Nov. 19, 1974

[54] HIGH BREAK DOWN VOLTAGE-COMBINED SEMICONDUCTOR DEVICE SUITABLE FOR FABRICATION OF VOLTAGE MULTIPLIER RECTIFIER CIRCUIT

[75] Inventors: Yoichi Nakashima; Hisashi Sakamoto; Takeshi Ishizuka; Kensuke Suzuki, all of Hitachi, Japan

[73] Assignee: Hitachi, Ltd., Tokyo, Japan

[22] Filed: June 6, 1973

[21] Appl. No.: 367,368

[30] Foreign Application Priority Data

June 12, 1972 Japan ................................ 47-57733

[52] U.S. Cl. ........................ 357/72, 357/75, 357/76, 317/101 CM, 29/588, 321/8 C, 321/15, 174/52 PE

[51] Int. Cl. ............................ H01l 3/00, H01l 5/00

[58] Field of Search ............ 317/234, 3, 3.1, 4, 4.1, 317/101 CM, 11; 321/8 C, 15; 174/52 PE; 29/588

[56] References Cited

UNITED STATES PATENTS

| | | | |
|---|---|---|---|
| 3,568,036 | 3/1971 | Rosenberg | 317/234 E |
| 3,590,327 | 6/1971 | Thomae | 317/234 A |
| 3,646,424 | 2/1972 | Dangschat | 317/234 A |
| 3,654,695 | 4/1972 | Delgaudio | 317/234 E |
| 3,716,776 | 2/1973 | Dangschat | 317/234 W |

*Primary Examiner*—Andrew J. James
*Attorney, Agent, or Firm*—Craig & Antonelli

[57] ABSTRACT

A combined semiconductor device composed of a plurality of semiconductor elements each molded with an insulating material such that the semiconductor element with lead wires is coated with the insulating material down to an appropriate position of each lead wire so that the remaining part of each lead wire is exposed for connection with other circuit elements, the molded semiconductor elements being connected with each other in a bridged manner with interspaces therebetween by means of an insulating material the same as or similar to the molding material.

12 Claims, 4 Drawing Figures

HIGH BREAK DOWN VOLTAGE-COMBINED SEMICONDUCTOR DEVICE SUITABLE FOR FABRICATION OF VOLTAGE MULTIPLIER RECTIFIER CIRCUIT

FIELD OF THE INVENTION

The present invention relates to a combined semiconductor device composed of a plurality of semiconductor elements molded in a single unit with their lead wires exposed so that they can be formed into a desired electric circuit.

DESCRIPTION OF THE PRIOR ART

With the recent transistorization of color television receivers a voltage multiplier rectifier circuit has come to be used in the high tension source circuit therefor which is composed of a combined semiconductor device.

Figure 1:
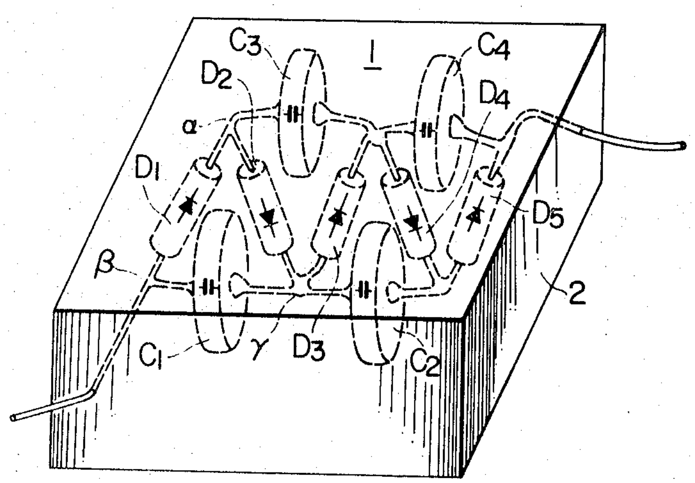
FIG. 1 PRIOR ART
FIG. 1 is a perspective view of a conventional molded voltage trebler rectifier.

The voltage multiplier rectifier circuit includes a voltage doubler, trebler, quadrupler, . . . rectifier circuit. In FIG. 1 there is illustrated a conventional solid state molded insulated voltage trebler rectifier circuit. The voltage trebler rectifier circuit 1 is composed of series connected five semiconductor rectifiers $D_1$ to $D_5$ and four voltage dividing capacitors $C_1$ to $C_4$ connected in parallel with the semiconductor rectifiers $D_1$ and $D_2$, $D_3$ and $D_4$, $D_2$ and $D_3$, and $D_4$ and $D_5$, respectively, and the whole assembly is molded with or embedded in a block of silicone rubber 2.

The voltage trebler rectifier circuit 1 has the following various disadvantages:

1. When the voltage trebler rectifier circuit 1 is molded in a small size, lead wires are apt to be disconnected at their junction points or exfoliated or detached from the molding material.
2. The adherence between the protective film of epoxy resin, glass, or the like covering the semiconductor rectifiers $D_1$ to $D_5$ and the silicone rubber 2, the molding material, is bad so that they are apt to be detached from each other. If the detachment occurs between the points $\alpha$ and $\gamma$ or between the points $\beta$ and $\gamma$, for example, the creeping distance is shorter resulting in a higher probability of creeping discharge with the smaller size of rectifiers.
3. Not only the connection between the semiconductor diodes $D_1$ to $D_5$ and the capacitors $C_1$ to $C_4$ is difficult, but also the miniaturization of the device is difficult.

SUMMARY OF THE INVENTION

An object of the present invention is to provide a solid state molded insulated combined semiconductor device whose miniaturization is easy and whose creeping distance is large.

Another object of the present invention is to provide a combined semiconductor device in which interconnection between circuit elements for forming a desired circuit is easy without any damage to lead wires.

The feature of the combined semiconductor device according to the present invention is that each of a plurality of semiconductor elements with lead wires is molded with an insulating material with end portions of the lead wires being exposed so that the semiconductor element can be connected with other circuit elements and the semiconductor elements are connected with each other in a bridged manner by the same insulating material as the molding material.

DESCRIPTION OF THE PREFERRED EMBODIMENTS

Figure 2:
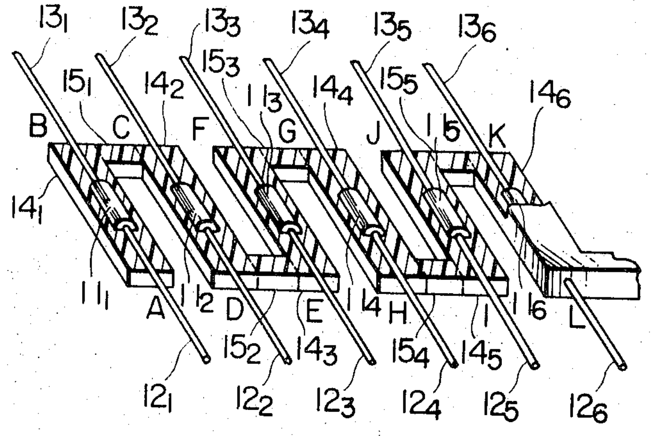
FIG. 2 is a partly cross-sectional perspective view of an embodiment of the combined semiconductor device according to the present invention.

In FIG. 2 which illustrates an embodiment of the present invention a plurality of semiconductor elements such as diodes $\mathbf{11}_1$, $\mathbf{11}_2$, . . . , $\mathbf{11}_n$ are covered with or embedded in an insulating material such as epoxy resin or glass $\mathbf{14}_1$, $\mathbf{14}_2$, . . . , $\mathbf{14}_n$ down to appropriate positions of their lead wires $\mathbf{12}_1$, $\mathbf{12}_2$, . . . , $\mathbf{12}_n$ and $\mathbf{13}_1$, $\mathbf{13}_2$, . . . , $\mathbf{13}_n$ taking the creeping distances between the lead wires $\mathbf{12}_1$ and $\mathbf{13}_1$, $\mathbf{12}_2$ and $\mathbf{13}_2$, . . . , $\mathbf{12}_n$ and $\mathbf{13}_n$ into consideration. The remaining portions of the lead wires $\mathbf{12}_1$, $\mathbf{12}_2$, . . . , $\mathbf{12}_n$ and $\mathbf{13}_1$, $\mathbf{13}_2$, . . . , $\mathbf{13}_n$ are exposed outside the end portions A, B, C, . . . of the insulating material $\mathbf{14}_1$, $\mathbf{14}_2$, . . . , $\mathbf{14}_n$ independently of each other.

Since the semiconductor elements $\mathbf{11}_1$, $\mathbf{11}_2$, . . . , $\mathbf{11}_n$ are embedded in the insulating material $\mathbf{14}_1$, $\mathbf{14}_2$, . . . , $\mathbf{14}_n$, it is unnecessary to provide the semiconductor elements with any protecting members against outer breaking forces except passivating means for protecting the *p-n* junction from electric breakdown or current leakage.

Adjacent semiconductor elements are connected in a bridged manner by an insulating material $\mathbf{15}_1$, $\mathbf{15}_2$, . . . , $\mathbf{15}_{n-1}$ the same as or similar to the insulating material $\mathbf{14}_1$, $\mathbf{14}_2$, . . . , $\mathbf{14}_n$ into an integral unit. For facilitating the connection of the lead wires to form the semiconductor device into a voltage multiplier rectifier circuit the connection of the semiconductor elements is made in the form of a line of battlement as shown in FIG. 2. The dotted lines between the end portions of the molding insulating material B and C, D, and E, F and G, H and I, . . . indicate the boundaries between the molding insulating material $\mathbf{14}_1$, $\mathbf{14}_2$, . . . , $\mathbf{14}_n$ and the bridging insulating material $\mathbf{15}_1$, $\mathbf{15}_2$, . . . , $\mathbf{15}_{n-1}$.

Figure 3:
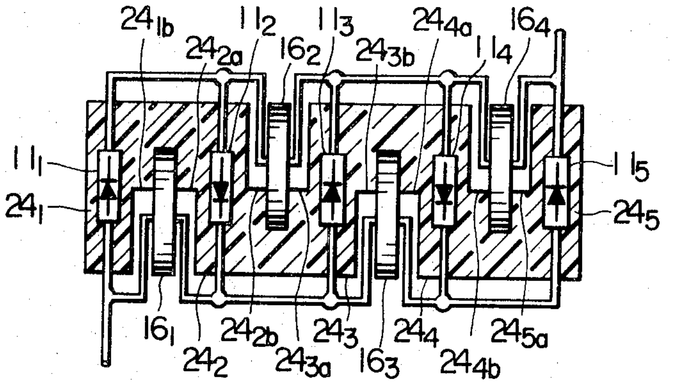
FIG. 3 is a partly cross-sectional plan view of a modification of the circuit of FIG. 2 formed into a practical circuit.

FIG. 3 is an embodiment of the voltage trebler rectifier circuit formed of the combined semiconductor device of FIG. 2, in which the insulating material is somewhat modified.

As is also the case with the embodiment of FIG. 2, the interspaces between the molded semiconductor elements of the device of FIG. 3 accommodate capacitors $\mathbf{16}_1$, $\mathbf{16}_2$, . . . for forming the device into a voltage trebler rectifier circuit, thus resulting in miniaturization of the voltage trebler rectifier circuit. In this case, only if the combined semiconductor device is fixed, the individual semiconductor elements are also fixed. Consequently, the connection of circuit elements such as capacitors is very easy so that the electrical and mechanical accuracies of an electric circuit, for example a voltage multiplier rectifier circuit, as a finished product are improved and the unevenness or dispersion thereof is much reduced.

Also, since the capacitors $16_1$, $16_2$, . . . are held between the shoulder portions $24_{1b}$ and $24_{2a}$, $24_{2b}$ and $24_{3a}$, . . . of the insulator $24_1$, $24_2$, . . . , the connecting operation between the lead wires of the semiconductor elements and the capacitors is easy and the disconnection of the lead wires is prevented.

The combined semiconductor device of FIG. 3 is finally molded with or embedded in a block of silicone rubber as in FIG. 1. In this case, even if exfoliation, detachment or cracking occurs between the insulating material such as epoxy resin or glass covering each semiconductor element and the silicone rubber due to the difference in the coefficient of thermal expansion resulting from the heating and cooling at the time of molding and operation of the device, no creeping discharge occurs because the creeping distance is extended by the insulating and bridging materials.

Since the following fact is similarly applicable both to the embodiments of FIGS. 2 and 3, a description thereof will be made with reference to FIG. 2. When, among the lead wires $12_1$ and $13_1$, $12_2$ and $13_2$, . . . , $12_n$ and $13_n$ of the semiconductor elements $11_1$, $11_2$, . . . , $11_n$, two adjacent lead wires of each of pairs of adjacent lead wires $13_1$ and $13_2$, $12_2$ and $12_3$, $13_3$ and $13_4$, . . . . . on the bridged side of the semiconductor elements are to be electrically connected, it is unnecessary for the bridging material $15_1$, $15_2$, . . . , $15_{n-1}$ to be an insulating material because of the same electrical potential of the pair of adjacent lead wires, but it is only necessary for the bridging material to be a mechanical connector. Consequently, it is not effective to make the bridging material unnecessarily long.

Figure 4:
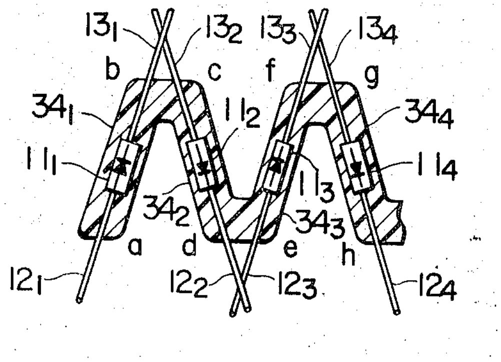
FIG. 4 is a partly cross-sectional view of another embodiment of the combined semiconductor device according to the present invention.

FIG. 4 illustrates an embodiment of the combined semiconductor device suitable for such a case. The semiconductor elements $11_1$, $11_2$, . . . , $11_n$ are connected at an angle at the ends b and c, d and e, f and g, . . . bridged by means of a material the same as or similar to the molding material $34_1$, $34_2$, . . . , $34_n$. By this structure the amount of the bridging material is reduced which is advantageous from the economical point of view. The lead wires at the bridged edges come close to each other or cross over. Consequently, the connection of the lead wires is easier as compared with the embodiments of FIGS. 2 and 3.

It will be easily understood that the embodiment of FIG. 4 also can be provided at its insulating material $34_1$, $34_2$, . . . , $34_n$ with shoulder portions as in the embodiment of FIG. 3 for facilitating the fixture of circuit elements such as capacitors.

Though the above embodiments are described as voltage multiplier rectifier circuits by way of example, the configuration of the combined semiconductor device according to the present invention can be modified as desired according to the kind of the component semiconductor elements, the circuit into which the combined semiconductor device is formed and the condition under which the circuit is operated. For example, the combined semiconductor device can be formed in a two or three dimensional corrugated configuration.

In FIG. 2 the boundaries between the molding material and the bridging material are indicated by the dotted lines. However, actually, they can be molded in one step with the same material. Also, a large number of semiconductor elements may be molded into a long unit, and then the unit may be cut into individual desired combined semiconductor devices.

We claim:

1. A combined semiconductor device comprising a plurality of semiconductor elements each having a pair of lead wires, first insulating material members for molding each semiconductor element down to appropriate positions of the lead wires with the remaining portions of the lead wires being exposed which are to be connected with external electric circuits, and second insulating material members for connecting the adjacent first insulating material members in a bridged manner along a rectangular waveform line with interspaces therebetween, each of said interspaces being able to fix another electric circuit element therein which is connected with the lead wires.

2. A combined semiconductor device according to claim 1, in which the lead wires of the adjacent semiconductor elements are connected with each other, and a capacitor is connected between the adjacent lead wires so as to be fixed in each of said interspaces.

3. A combined semiconductor device according to claim 1, in which adjacent molded semiconductor elements are connected at an acute angle.

4. A combined semiconductor device according to claim 2, in which adjacent molded semiconductor elements are connected at an acute angle.

5. A circuit device comprising:

a plurality of circuit components, each of which has a component body proper and first and second lead wires extending from opposite ends thereof;

a plurality of embedding insulating members in which each of said components is respectively embedded, with the respective bodies proper being completely embedded, and prescribed portions of said lead wires extending therefrom being embedded, while the outer extremity portions of each of said first and second lead wires extend from a respective insulating member for providing exclusive electrical connections to said components; and a plurality of bridging insulating members disposed between respective alternate opposite ends of said embedding insulating members, connecting adjacent ones of said embedding insulating members together in serpentine fashion, thereby leaving spaces between adjacent embedding insulating members in which additional circuit components, external to the embedded components, may be disposed for electrical connection therewith by way of said extremity portions of said first and second lead wires.

6. A circuit device according to claim 5, wherein each of said embedding insulating members is substantially parallel to the other embedding insulating members, so that said serpentine fashion is substantially rectangularly serpentine.

7. A circuit device according to claim 5, further comprising a plurality of additional circuit components, each having a component body proper and a pair of lead wires extending therefrom, respectively disposed in the spaces between said embedding insulating members, and each of which is connected by way of said pair of lead wires to the extremity portions of respectively adjacent lead wires extending from the circuit components embedded in the insulating members defining the respective spaces.

8. A circuit device according to claim 7, wherein only a portion of only the body proper of each additional circuit component is held by the bridging insulating member connecting the adjacent embedding insulating members in the space between which said additional circuit component is disposed.

9. A circuit device according to claim 5, wherein adjacent embedding insulating members are oriented at an acute angle relative to one another, so that the respective spaces therebetween are substantially wedge-shaped, whereby the extremity portions of adjacent pairs of lead wires cross over one another.

10. A circuit device according to claim 9, further comprising a plurality of additional circuit components, each having a component body proper and a pair of lead wires extending therefrom, respectively disposed in the spaces between said embedding insulating members, and each of which is connected by way of said pair of lead wires to the extremity portions of respectively adjacent lead wires extending from the circuit components embedded in the insulating members defining the respective spaces.

11. A circuit device according to claim 10, wherein only a portion of only the body proper of each additional circuit component is held by the bridging insulating member connecting the adjacent embedding insulating members in the space between which said additional circuit component is disposed.

12. A circuit device according to claim 5, wherein said embedding insulating members and said bridging insulating members are formed of a single continuous insulating member.

* * * * *